United States Patent [19]
Colli et al.

[11] Patent Number: 5,742,193
[45] Date of Patent: Apr. 21, 1998

[54] DRIVER CIRCUIT INCLUDING PRESLEWING CIRCUIT FOR IMPROVED SLEW RATE CONTROL

[75] Inventors: Gianluca Colli, Santa Clara; Massimiliano Brambilla, San Jose, both of Calif.

[73] Assignee: SGS-THOMSON Microelectronics, Inc., Carrollton, Tex.

[21] Appl. No.: 740,195

[22] Filed: Oct. 24, 1996

[51] Int. Cl.$^6$ .................................................. H03K 5/12
[52] U.S. Cl. ................... 327/170; 327/108; 327/377; 327/437
[58] Field of Search .................. 327/108–112, 170, 327/374–377, 423, 424, 427, 432, 434, 437; 318/254

[56] References Cited

U.S. PATENT DOCUMENTS

| | | | |
|---|---|---|---|
| 5,191,269 | 3/1993 | Carobolante | 318/254 |
| 5,306,988 | 4/1994 | Carobolante et al. | 318/254 |
| 5,311,084 | 5/1994 | Gabara | 327/170 |
| 5,374,857 | 12/1994 | Carobolante | 327/110 |
| 5,514,939 | 5/1996 | Schlager et al. | 318/254 |
| 5,568,081 | 10/1996 | Lui et al. | 327/170 |

OTHER PUBLICATIONS

Gariboldi, "Motion Control," appearing in *Smart ICs*, Murari et al., Eds., 1995, Ch. 5, pp. 225–283.
Grebene, *Bipolar and MOS Analog Integrated Circuit Designs*, 1984, Sec. 4.1 pp. 171–183, and Sec. 6.2, pp. 271–277.

*Primary Examiner*—Timothy P. Callahan
*Assistant Examiner*—Kenneth B. Wells
*Attorney, Agent, or Firm*—Theodore E. Galanthay; Lisa K. Jorgenson; Gordon H. Telfer

[57] ABSTRACT

A preslewing circuit to rapidly drop a voltage on the gate of a power device in a power stage has a combination of a bipolar transistor and CMOS transistors. The gate voltage is brought down by the preslewing circuit to a level at which an output voltage can begin to change. The combination has high conduction and can be integrated readily, with good internal isolation, in a small chip area, thus having qualities desirable for high performance, integrated, driver circuits.

13 Claims, 1 Drawing Sheet

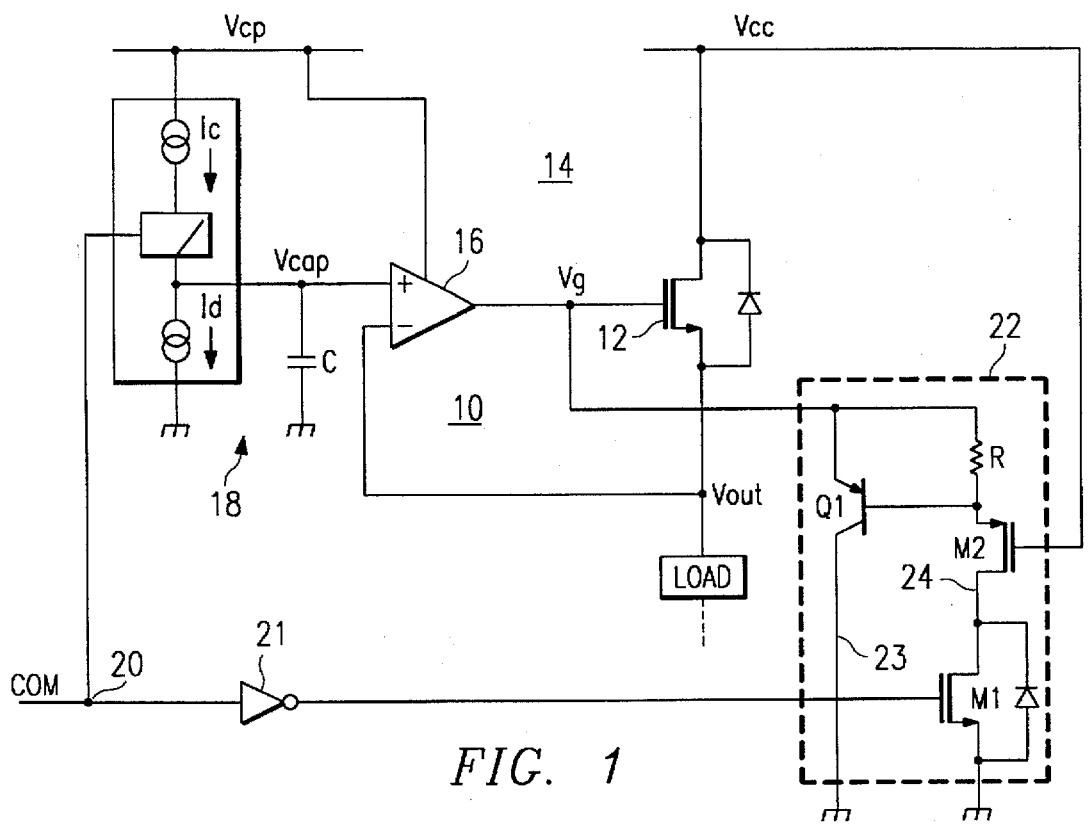
FIG. 1
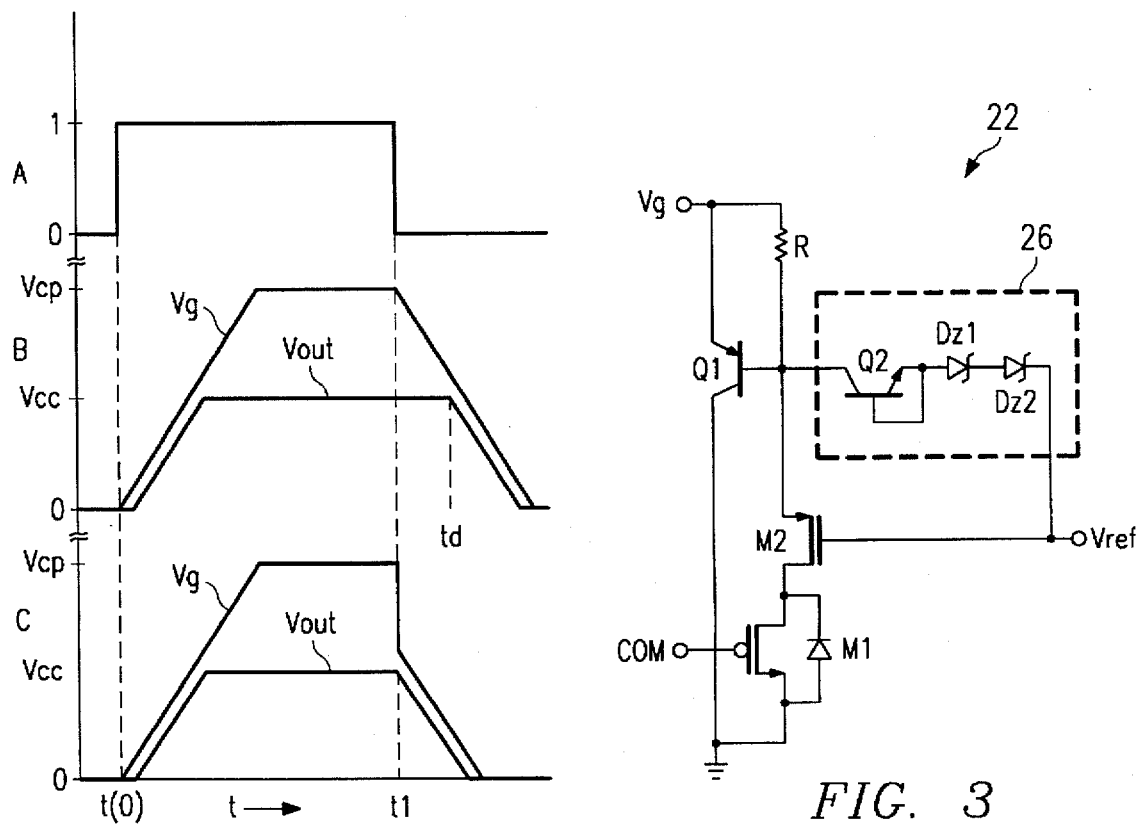
FIG. 2
FIG. 3

5,742,193

DRIVER CIRCUIT INCLUDING PRESLEWING CIRCUIT FOR IMPROVED SLEW RATE CONTROL

RELATED APPLICATIONS

This application is generally related in subject matter to the following applications by the same inventors and assigned to the same assignee which contain other inventions relevant to driver circuits: Ser. No. 740,129 and Ser. No. 736,524, both filed the same date as the present application.

BACKGROUND OF THE INVENTION

1. Field of the Invention

The invention relates to drive circuits for a power device of a power driving stage and particularly to a driver circuit operating from a supply voltage (e.g., a charge pump voltage) that is higher than the supply voltage of the power device.

The invention is particularly beneficial for high side drivers in integrated circuits for energizing spindle motor coils, such as for hard disk drives.

2. Description of Related Art

A driver circuit is generally a relatively low power circuit that drives, or controls, a higher power device. The power device may be part of a power driving stage for a load. An example is a load that is a motor, such as a brushless motor, that provides the motive force for a spindle of a hard disk drive. Similar driver circuits are applied elsewhere, such as in voice coil motor (VCM) systems.

One of the most widely used types of driver circuits in such applications uses a three-phase brushless motor in a configuration in which current energizes respective motor coils using a full wave bridge configuration. The bridge includes two power stages for each phase, so typically there are six power stages each with a power device. Three of the power stages and their power devices are referred to as being "low side" stages and devices because they are connected between a motor coil and ground. The other three of the power stages, and their power devices, are referred to as "high side" stages and devices because they are connected between a power supply and a motor coil.

The power devices are operated as switches in a sequence that allows pulses of current to flow from the power supply through a high side power device, a coil of a first of the three stages, a coil of a second of the three stages, and then through a low side power device to ground. This process is repeated in a generally well known manner for the other power devices and coil pairs to achieve three-phase energization from a single, direct current, power supply. The switching, or commutation, characteristics of the power devices are very important in achieving good performance from the motor and other favorable characteristics.

Control of the switching of the power devices is performed by a driver circuit for each power device. In the typical use described above with six power stages, there are three low side drivers and three high side drivers. The power devices may be of a variety of electronic switch devices and the driver circuits are configured suitably for the power devices. Power devices of general application to hard disk drives, and the like, are each often an MOS (metal-oxide-semiconductor) FET (field effect transistor). One type of such transistors of considerable interest is referred to as a DMOS transistor (D referring to a double diffusion process used in its manufacture).

DMOS devices can be readily integrated in chips with other circuitry, including lower power control circuitry. So it is attractive to have an entire set of drive stages, including all the power devices and all the driver circuits for the power devices, in one chip.

Even where all the power devices are alike, e.g., N channel DMOS devices, it is generally the case that the high side drivers differ from the low side drivers because high side drivers for such power devices often require a voltage, referred to as a charge pump voltage or boost voltage, at a higher voltage level than that supplied by the power supply for the power stages. By known techniques, a charge pump voltage may be generated from the supply voltage and used by all the high side drivers. Such an auxiliary supply is, however, power limited; the desired voltage can be supplied but at a modest current level.

The state of the art in the field of motion control using integrated signal and power components, the respective requirements of low and high side drivers, and the characteristics sought in applications of motor drives are described more fully in *Smart Power ICs*, B. Murari et al., Eds., 1995, particularly Chapter 5, "Motion Control" by R. Gariboldi, at pp. 225–283, which is herein incorporated by reference for its description of background to the present invention.

As is known, for example from the above-mentioned Gariboldi publication, for applications such as hard disk drives, it is of utmost importance to control the output voltage slope in order to reduce electromagnetic interference (EMI). Generally, the slope is desired to be steep but not so abrupt as to cause any appreciable noise. Drive circuits have therefore generally included slew rate control circuits to achieve fast, smooth transitions.

Techniques previously used for high side slew rate control (cf., Gariboldi) have included one in which the gate node of a power DMOS device is charged and discharged by constant current sources. A first constant current source is applied between the charge pump voltage supply and the gate node. A second constant current source is applied between the gate node and ground. The inherent input capacitance of the power device during rise and fall times is relatively constant. The slew rate or voltage slope is proportional to the sourced currents divided by the capacitance. Another known slew rate control technique uses a capacitor separate from the inherent capacitance of the power device. It can be more accurate since the specific capacitance used can be better controlled. However, practical limitations are encountered in order to integrate such a circuit into a small chip area.

These limitations are related to the fact that the high side power device requires an overvoltage driving signal at its gate of about 10 v. more than the motor voltage supply. If the motor voltage supply is, for example, 17 v., until the gate voltage has risen to at least 17 v., the slew rate control loop is closed. When the gate voltage starts to ramp up from 17 v. to about 27 v., the slew rate control loop is open and the high side op-amp pushes the gate to the charge pump voltage. A problem arises, particularly when there is to be a transition or commutation from on to off and the drive is to be reduced with a fixed slew rate. At the beginning of such a transition, the gate is at the overvoltage of about 27 v. and the source of the power device is at about 17 v. It therefore takes time to discharge the gate down to 17 v. when the output can start reducing. Preslewing is a process to reduce that delay. To do so with past circuit designs for a good slew rate control requires elements occupying a very substantial chip area. It is desirable, at least of some drives, for the commutation to occur at least as fast as 15 v./microsecond. That would normally mean a huge P-channel device and a huge lateral N-channel DMOS structure in a current sinking path of a preslewing circuit. Huge, in this context, means about 400–600 microns for the channel dimension.

SUMMARY OF THE INVENTION

The invention achieves effective slew rate control, with readily integrated elements, by combining with the basic elements of a slew rate control system, a relatively easy to fabricate preslewing circuit. The preslewing circuit affects the current sinking to be performed when the drive circuit is fully on, a command to transition off has been received by the drive and the gate is still above the source voltage. It is desirable to bring the gate voltage down to the source voltage quickly. Then the actual transition of the output can begin, under the influence of the basic elements of a slew rate control system.

A preslewing circuit according to the invention uses a bipolar transistor as the principal current carrying element. The bipolar transistor is combined in the preslewing circuit with a complementary pair of field effect transistors including one that has a channel polarity like the predominant polarity of the bipolar transistor (e.g., P-channel FET with a PNP bipolar). The other field effect transistor has a channel of opposite polarity (e.g., N-channel FET).

The FETs are a complementary pair in the sense they have channels of opposite polarity (thus a bipolar-CMOS combination of the three transistors). In contrast to a bipolar-bipolar (or Darlington) combination, which is also an arrangement that could theoretically provide a large current capacity, the present invention is better in avoiding unwanted DC paths when the devices are integrated by the usual techniques; there is current flowing only where you want to have current.

It is noted that the complementary pair of FETs used is preferably not a matched pair in terms of power capability. It is preferred to use a moderate sized device of one polarity (e.g., P-channel) and a more substantial sized device of the other polarity (e.g., an N-channel DMOS). This, along with a basic bipolar PNP transistor, will have much improved current capability in a compact chip area.

In preferred embodiments, the transistors are arranged so that the bipolar transistor provides a path to ground for current from the gate of the drive circuit power device that is a parallel alternative to the path through the complementary FETs. More specifically, a bipolar PNP has its emitter connected to the power gate and its collector to ground. The complementary pair has the source of a P-channel connected to a node at the bipolar base. A resistor is connected between that node and the node where the bipolar emitter connects with the power gate. The drain of the P-channel is connected with the drain of the N-channel, whose source is connected to ground.

A supply voltage, which may be from the same supply as that supplying the channel of the N-channel DMOS power device, or Vcc, is connected to the P-channel gate, and is positive relative to ground. A command signal terminal is on the gate of the N-channel DMOS in the preslewing circuit.

In operation, when the power device is on, the output voltage at the source of the power device is high, substantially at Vcc. The gate of the power device is also high, typically at the overvoltage, or charge pump voltage, Vcp, or about 10 v. above Vcc.

When the gate of the N-channel in the preslewing circuit gets a command signal for a transition from on to off, the preslewing circuit starts into operation and helps shorten the delay between the command signal and the actual start of the turn-off of the power device. The combination of transistors in the preslewing circuit results in turning on the PNP for rapid current sinking and reduction of Vg.

A voltage limiting circuit branch can be connected between the P-channel gate and source for protection against an overvoltage. This is merely to allow greater flexibility in chip design.

With the preslewing circuit, the gate voltage, and hence the output voltage, ramps down smoothly and linearly with only a short delay time, and the circuit can be readily fabricated in only a small chip area.

The preslewing circuit is not a factor during off to on transitions. When an off to on command occurs, it will not conduct, there will be good isolation (despite the small required area), and the voltage at the gate of the power device can rise without being affected by the preslewing circuit.

When the gate voltage Vg is reduced to no more than the supply, Vcc, actual reduction in the output voltage begins. The slew rate of the further reduction in Vg and Vout is then determined by the slew rate control circuit including the slew rate capacitor and its charge and discharge current sources.

The fact that the P-channel gate is connected to the same power supply Vcc as that across the power device channel makes sure the preslewing circuit automatically turns off and the slew rate control circuit takes over at the correct voltage level.

The foregoing and further aspects of the present invention will become more apparent from the following description and accompanying drawings.

BRIEF DESCRIPTION OF THE DRAWINGS

FIG. 1 is a circuit schematic of an embodiment of the present invention;

FIG. 2 is a set of waveforms illustrating the performance of the invention; and, FIG. 3 is circuit schematic showing a further embodiment of the invention.

DESCRIPTION OF PREFERRED EMBODIMENTS

Referring to FIG. 1, a power driving stage 10 is shown. The power driving stage 10 includes a power device 12 that in this example is an MOS transistor, more specifically an N-channel DMOS transistor. DMOS transistors are known power devices and device 12 is illustrated with an intrinsic diode between its source and drain.

Power device 12 has a controllable conduction path through a channel between its drain and source. A gate electrode serves as a control electrode for controlling conduction through the channel.

Power driving stage 10 with power device 12 includes a driver circuit 14 for controlling the voltage at the gate of device 12 and therefore the conduction of the power device.

In this example, power device 12 is connected for selectively applying power to a load which is above ground potential. Driver circuit 14 is therefore referred to as a high side driver. The circumstances described in the background above show particular requirements of high side DMOS drivers that are to be improved, particularly where the load is a set of inductive motor coils of multiple phases with additional high side driver circuits (not shown) all integrated with power stage 10 in the same chip.

The power device 12 receives a DC voltage Vcc from a first power supply connected to its drain. Vcc is typically from an external supply and is equal to about 12 to 17 v. The characteristics of DMOS devices, like device 12, require a second voltage Vcp provided at a voltage level higher than Vcc, e.g., 27 v. Vcp is a charge pump or boost voltage or overvoltage typically generated by known means within the chip.

In the driver circuit 14, charge pump voltage Vcp is supplied to an amplifier 16 and also to a slew rate control circuit portion 18 represented by a slew rate capacitor C, that is charged and discharged in accordance with known practice by constant current sources Ic and Id. Slew rate controls and high side driver circuits are further described in the above mentioned copending applications and such descriptions are herein incorporated by reference.

In basic operation, command signals in the form of "0" or "1" logic are received by driver circuit 14 at a command terminal 20 that initiates action. For example, a "0" signal is a command to the driver 14 to stay or go off with a Vg down to zero and a "1" signal is a command to stay or go on with a high Vg up to Vcp. Particular attention is to be given to the transitions or commutations of the power device 12. When the power device 12 is to go from off to on, Vg is to be driven smoothly at a slew rate proportional to the current of source Ic divided by capacitance C. Upon a command for an on to off transition, a smooth decline in Vg occurs at a slew rate proportional to the current of source Id divided by the capacitance.

Amplifier 16 may, for example, be an operational amplifier or op-amp. The capacitor voltage Vcap is applied to the positive input terminal (+) of the amplifier 16. A feedback signal from the source of power device 12 is applied to the negative input terminal (−) of the amplifier 16. By known amplifier techniques, the amplifier 16 operates on the inputs, using power from Vcp, so the gate voltage Vg ranges from an off level of zero and an on level of Vcp.

Circuit portion 22 is a preslewing circuit connected to bring Vg down rapidly to a level, such as Vcc, equal to the output Vout when device 12 is fully on.

Before describing the rest of FIG. 1, reference is made to FIG. 2 which shows a set of three voltage waveforms A, B and C on the same time axis. Waveform A shows the form of command signals at terminal 20 of FIG. 1. At time t(o), the command logic goes from "0" to "1".

Waveform B shows the shapes of Vg and Vout if there is no preslewing circuit. Waveform C shows the shapes of Vg and Vout with a preslewing circuit such as circuit portion 22.

As shown in waveforms B and C at t(o) Vg immediately begins slewing up to its maximum Vcp. At time t1, an off command is received and waveform B shows Vg slews down at the same slope it had going up.

Waveform B also shows the shape of Vout which parallels Vg with only a small time interval difference up to its maximum at Vcc where it remains until after an off command. The time delay between t1, when the command is given, to td, when Vout starts down, is due to the time required to discharge the gate down substantially to Vcc which is substantially equal to the voltage at the source of device 12, or Vout, when device 12 is fully on. (The waveforms are only approximate for illustrative purposes.)

Waveform C shows the benefit of having preslewing. Vg has a very abrupt drop from Vcp to Vcc and the output voltage starts down substantially immediately when the command at t1 is made. From Vcc down to zero, both Vg and Vout are slewed down at the rate set by the capacitor C and its current sources Ic and Id in slew rate control circuit 18.

While prior preslewing circuits are known, they have limitations as described in the background. Returning to FIG. 1, preslewing circuit 22 includes three transistors, bipolar Q1, and field effect transistors M1 and M2. Q1 is in a first circuit branch 23 between the gate of device 12 and ground. M1 and M2 are in a second circuit branch 24 between the gate of device 12 and ground. The gate of M1 is connected to command signal terminal 20. The gate of M2 is connected to a power supply supplying a voltage from the same supply Vcc as is applied to the channel of device 12, i.e., substantially the same as the maximum output voltage of the power device at the source of the power device.

M1 and M2 are complementary field effect transistors.

The illustrated means for interconnecting the circuit branches 23 and 24 comprising the interconnection from the source of M2 to the base of Q2, provides operation wherein a command signal for an on to off transition initiates conduction between the gate of device 12 and ground that rapidly reduces Vg down substantially to the level of Vcc or a voltage equal to the power device source voltage when the command is received. The conduction starts by M1 and M2 turning on so the base of Q1 is appropriately biased for turn on.

The level at which the preslewing circuit 22 stops operating and the slew rate control circuit 18 takes over further reduction in Vg should be no less than the maximum Vout at the source of device 12 or Vcc. In the described embodiment it is satisfactory for M2 to turn off when Vg is down to about 1 v. greater than Vcc. Connecting the gate of M2 to Vcc, the same power supply as for power device 12, provides an automatic turn-off of the preslewing circuit at a proper level. It is automatic in the sense that no additional sensors or logic elements are required.

In the specific embodiments, where the power device 12 is a DMOS device with a first conductivity type (e.g., N type) channel, the bipolar Q1 has a base of same first conductivity type and second conductivity type emitter and collector (e.g., PNP), M1 is also a DMOS device with a first conductivity type (e.g., N type) channel, and the complementary M2 is of the second type (e.g., P type) channel. For such an example in which M1 is an N channel device, it is appropriate to have a command signal at the gate of M1 for an on to off transition that is a logic "1". Therefore, an inverter 21 is shown in the connection from the command terminal 20 and the gate of M1. In that configuration, operation can proceed as described in connection with FIG. 2, waveforms A and C.

The emitter of Q1 is connected to the gate of device 12 and the collector of Q1 is connected to ground.

M1 has its source connected to ground and its drain connected to the drain of M2.

M2 has it source connected to the base of Q1 and also is connected through a resistor R to the emitter of Q1, and also the gate of device 12.

This combination of bipolar-CMOS transistors is particularly favorable when they are all integrated, with a power device, in a single chip, which may also contain other such power stages. The bipolar Q1 provides very high conduction in a small chip area. The FETs M1 and M2 need not be especially large so it is possible to integrate the combination shown in a chip area about 1/10 that required using prior art circuitry.

Because of the use of both bipolar and CMOS devices there is good isolation without unwanted DC paths when ordinary integration techniques are used.

FIG. 3 illustrates a further aspect of the present invention. A preslewing circuit portion 22 like that of FIG. 1 is shown with the addition of a protection circuit 26 for limiting the voltage between the gate and source of M2. The protection circuit 26 provides a degree of insurance against breakdown in the preslewing circuit so that there is greater flexibility in implementing it in integrated form.

In this example, protection circuit 26 is a circuit branch with a bipolar transistor (e.g., NPN) structure Q2 having a base-emitter short so it acts as a diode and a pair of serially connected Zener diodes Dz1 and Dz2. The protection circuit is an optional feature of the preslewing circuit.

Embodiments of the invention may of course vary from those specifically shown or described herein.

What is claimed is:

1. A preslewing circuit, for reducing a gate voltage Vg of a power device of a driver circuit in order to turn off the power device when vg is above the output voltage of the power device, comprising:

a bipolar transistor in a first circuit branch between the power device gate and ground;

a complementary pair of field effect transistors in a second circuit branch between the power device gate and ground, said field effect transistors add said bipolar transistor being integrated within a single circuit chip with the power device;

one of the field effect transistors having a gate terminal connected to receive on-off command signals, the other of the field effect transistors having a gate terminal connected to a power supply; and circuit means for interconnecting the first and second circuit branches comprising a connection from the second circuit branch to the bipolar transistor of the first circuit branch to turn on the bipolar transistor wherein the first and second circuit branches and the circuit means for interconnecting are arranged such that one of the command signals for an on to off transition initiates conduction between the power device gate and ground to reduce Vg down to a level substantially equal to the maximum power device output voltage, and wherein conduction by both of the field effect transistors causes turn-on of the bipolar transistor.

2. The preslewing circuit of claim 1 wherein:

the power device is a DMOS device with a first conductivity type channel, the bipolar transistor has a base of the first conductivity type and an emitter and a collector of a second conductivity type, the emitter of the bipolar transistor is connected to the gate of the power device, the collector of the bipolar transistor is connected to ground;

the one field effect transistor has a first conductivity type channel with its source connected to ground and its drain connected to the drain of the other field effect transistor; and the other field effect transistor has a second conductivity type channel with its source connected with the bipolar transistor base and also connected through a resistor to the bipolar transistor emitter.

3. The preslewing circuit of claim 2 wherein:

the power device is an N-channel DMOS device the bipolar transistor is a PNP transistor, the one field effect transistor is an N-channel DMOS device, the other field effect transistor is a P-channel device, and the power supply to which the gate of the other field effect transistor is connected supplies a voltage is the same as that applied to the channel of the power device.

4. A driver circuit having a slew rate control system comprising:

a power device for controlling conduction between a power supply and a load and operating from a first power supply; and a control circuit portion connected to a control terminal of the power device and comprising an amplifier and a slew rate control system coupled to an amplifier input, said control circuit portion operating from a second power supply at a voltage higher than that supplied by the first power supply;

the slew rate control system including a capacitor arranged to be charged and discharged by respective current sources;

the slew rate control system further including a preslewing circuit portion that comprises:

a first polarity bipolar transistor connected with its base-emitter path between the control terminal of the power device and a ground potential, and a complementary pair of unipolar transistors each having a source, a drain, and a gate, the source to drain paths of the complementary pair being connected in series in a path between the control terminal of the power device and the ground potential, the gate of the first of the complementary pair being coupled to a power supply of a predetermined voltage whose magnitude is substantially equal to the magnitude of output voltage at which the preslewing circuit is to stop operation, the gate of the second of the complementary pair being coupled to a command terminal for receiving command signals for turning the power device on and off.

5. The driver circuit of claim 4 wherein:

the bipolar transistor and complementary pair of field effect transistors are connected so an on to off command at the command terminal causes current conduction through the preslewing circuit portion to hasten reduction of voltage at the control terminal of the power device to a level of the predetermined voltage.

6. The driver circuit of claim 4 wherein: the gate of the first of the complementary pair of unipolar transistors is coupled to the first power supply.

7. In a driver circuit capable of integration in a compact chip area, a preslewing circuit portion comprising:

a power supply terminal for a power supply of a voltage substantially equal to a maximum drive circuit output voltage;

a power device terminal connected to a control terminal of said power device;

a command signal terminal for receiving commands for transitions of the power device;

a first polarity field effect transistor with a gate connected to the power supply terminal;

a second polarity field effect transistor with a gate connected to the command terminal, said first polarity and said second polarity field effect transistors having channels serially connected between the power device terminal and a ground terminal;

a bipolar transistor having a predominant polarity of the same type as the channel of the first polarity field effect transistor, the bipolar transistor having an emitter-collector path coupled between the power device terminal and the ground terminal; the bipolar transistor having a base terminal connected to the source of the first polarity field effect transistor; and a resistor connected from the bipolar transistor collector to the connection of the bipolar transistor base and first polarity field effect transistor source;

whereby the preslewing circuit is capable of rapidly reducing the voltage at the power device terminal down to substantially the voltage at the power supply terminal.

8. The apparatus of claim 7 wherein:

the field effect transistors and the bipolar transistor are arranged so that an on to off command signal at the command terminal rapidly starts current flow from the power device terminal to ground and lowers the voltage of the power device terminal to that of the power supply terminal at which time the preslewing circuit is substantially electrically isolated from the power device.

9. The apparatus of claim 7 further comprising:

a voltage limiting protection circuit is connected between the gate and source of the first polarity field effect transistor.

10. A high side driver circuit comprising:

a field effect transistor power device that utilizes a gate control voltage, Vg, of a maximum magnitude, Vcp, higher than the supply voltage, Vcc, of a source to drain conduction path of the power device, where Vcc is also substantially the maximum output voltage of the driver circuit;

a preslewing circuit for rapidly varying Vg from Vcp to Vcc during turn off of the power device and slew rate control means for varying Vg from Vcc to 0 for turn off of the power device at a predetermined slope wherein the rate of varying Vg from Vcc to 0 is more gradual than the rate of varying Vg from Vcp to Vcc;

said preslewing circuit comprising a bipolar transistor having a conduction path between the power device gate and ground and also comprising a complementary pair of field effect transistors, each having a gate, interconnected with the bipolar transistor so that a predetermined command signal to the gate of a first of the complementary pair of field effect transistors initiates conduction of the bipolar transistor which continues until Vg substantially equals Vcc and then stops, and allows the slew rate control means to perform further reduction of Vg at the predetermined slope.

11. The driver circuit of claim 10 wherein:

the gate of a second of the complementary pair of field effect transistors is maintained at a voltage substantially equal to Vcc for turning off conduction of the bipolar transistor when Vg substantially equals Vcc.

12. The driver circuit of claim 9 wherein:

the bipolar transistor and the complementary pair of field effect transistors of the preslewing circuit are in a single integrated circuit with the field effect transistor power device.

13. The driver circuit of claim 11 wherein:

the preslewing circuit is arranged to stay off during transitions of Vg from 0 up to Vcp for turn on of the power device.

* * * * *